United States Patent
Innes et al.

(10) Patent No.: US 10,658,718 B2
(45) Date of Patent: May 19, 2020

(54) METHODS, DEVICES AND SYSTEMS FOR PROVIDING POWER TO A LINEAR AMPLIFIER

(71) Applicant: AT&T Intellectual Property I, L.P., Atlanta, GA (US)

(72) Inventors: Timothy Innes, Atlanta, GA (US); Elizabeth Marlow, Atlanta, GA (US); Hifza Sakhi, Lilburn, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 87 days.

(21) Appl. No.: 15/973,635

(22) Filed: May 8, 2018

(65) Prior Publication Data
US 2019/0348731 A1   Nov. 14, 2019

(51) Int. Cl.
*H01M 10/44*   (2006.01)
*H01M 10/46*   (2006.01)
(Continued)

(52) U.S. Cl.
CPC ......... *H01M 16/003* (2013.01); *H01M 4/368* (2013.01); *H01M 8/04216* (2013.01);
(Continued)

(58) Field of Classification Search
CPC ............... H02J 7/35; H02J 7/355; H02J 7/007
(Continued)

(56) References Cited

U.S. PATENT DOCUMENTS

| 9,537,699 B2 | 1/2017 | Kenney et al. | |
|---|---|---|---|
| 2014/0184162 A1* | 7/2014 | Takahashi | H02J 7/007 320/128 |

(Continued)

FOREIGN PATENT DOCUMENTS

WO   2012020770 A1   2/2012

OTHER PUBLICATIONS

Choi, Jinsung et al., "Envelope Tracking Power Amplifier Robust to Battery Depletion", Microwave Symposium Power Amplifier Robust to Battery Depletion, Microwave Symposium Digest (MTT), 2010 IEEE MTT-S International 2010, 2010, pp. 1074-1077.
(Continued)

*Primary Examiner* — Edward Tso
(74) *Attorney, Agent, or Firm* — Guntin & Gust, PLC; Atanu Das

(57) ABSTRACT

Aspects of the subject disclosure may include, for example, a redox battery system comprising a three dimensional array of a plurality of nano-batteries and a hydrogen power system comprising a nano-array of hydrogen paper, a heat source and a water source, wherein the hydrogen paper attracts hydrogen from the water source. Further embodiments can include a solar power system comprising an array of a plurality of nano-solar cells and an ionic diode power system comprising two electrodes separated by a polycarbonate membrane, two borophene electric charge capture devices, and a capacitor stack. Additional embodiment can include a power supply controller providing power to a linear amplifier using the redox battery system and causing recharging of the redox battery system utilizing the hydrogen power system, the solar power system, the ionic diode power system, or a combination thereof, to provide charge to the redox battery system. Other embodiments are disclosed.

20 Claims, 15 Drawing Sheets

(51) Int. Cl.
  *H01M 16/00* (2006.01)
  *H01M 8/18* (2006.01)
  *H01M 8/2455* (2016.01)
  *H01M 8/0606* (2016.01)
  *H01M 8/04082* (2016.01)
  *H02S 40/38* (2014.01)
  *H02J 7/35* (2006.01)
  *H01M 4/36* (2006.01)
  *H01L 27/30* (2006.01)

(52) U.S. Cl.
  CPC ......... *H01M 8/0606* (2013.01); *H01M 8/188* (2013.01); *H01M 8/2455* (2013.01); *H02J 7/35* (2013.01); *H02S 40/38* (2014.12); *H01L 27/301* (2013.01); *H01M 2250/10* (2013.01); *H01M 2300/002* (2013.01); *H01M 2300/0028* (2013.01)

(58) Field of Classification Search
  USPC ................ 320/101, 107, 112, 114, 138, 103; 136/291, 293; 252/62.2
  See application file for complete search history.

(56) References Cited

U.S. PATENT DOCUMENTS

2016/0323017 A1 11/2016 Stratford et al.
2017/0358943 A1 12/2017 Bocus et al.

OTHER PUBLICATIONS

Park, Dong-Hyun et al., "A New Papr Reduction Technique of OFDM System With Nonlinear High Power Amplifier", IEEE Transactions on Consumer Electronics 53.2, 2007, pp. 327-332.

Science Daily, "A Big Nano Boost for Solar Cells", https://www.sciencedaily.com/releases/2017/01/170118082439.htm, Kyoto Univeristy, Jan. 18, 2017, 3 pages.

Science Daily, "Hydrogen in Your Pocket? New Plastic for Carrying and Storing Hydrogen", https://www.sciencedaily.com/releases/2016/11/161128131524.htm, Waseda Univeristy, Nov. 28, 2016, 3 pages.

Science Daily, "Major Advance in Solar Cells Made From Cheap, Easy-To-Use Perovskite", https://www.sciencedaily.com/releases/2016/11/161108153323.htm, University of California—Berkeley, Nov. 8, 2016, 4 pages.

Science Daily, "Scientists Boost Catalytic Activity for Key Chemical Reaction in Fuel Cells", https://www.sciencedaily.com/releases/2016/12/161216115518.htm, DOE/Brookhaven National Laboratory, Dec. 16, 2016, 4 pages.

Science Daily, "Stabilizing Energy Storage", https://www.sciencedaily.com/releases/2017/02/170221102034.htm, University of Utah, Feb. 21, 2017, 3 pages.

Wikipedia, "Linear Amplifier", https://en.wikipedia.org/wiki/Linera_amplifier, Mar. 21, 2018, 3 pages.

* cited by examiner

290

299

METHODS, DEVICES AND SYSTEMS FOR PROVIDING POWER TO A LINEAR AMPLIFIER

FIELD OF THE DISCLOSURE

The subject disclosure relates to methods, devices, and systems for providing power to a linear amplifier.

BACKGROUND

Linear amplifiers are used to strengthen data signals in communication networks. Further, linear amplifiers require power to operate. In some circumstances, a linear amplifier can be placed in a remote location such that providing power to the linear amplify can be expensive, unreliable, or infeasible.

BRIEF DESCRIPTION OF THE DRAWINGS

Reference will now be made to the accompanying drawings, which are not necessarily drawn to scale, and wherein.

DETAILED DESCRIPTION

Figure 1:
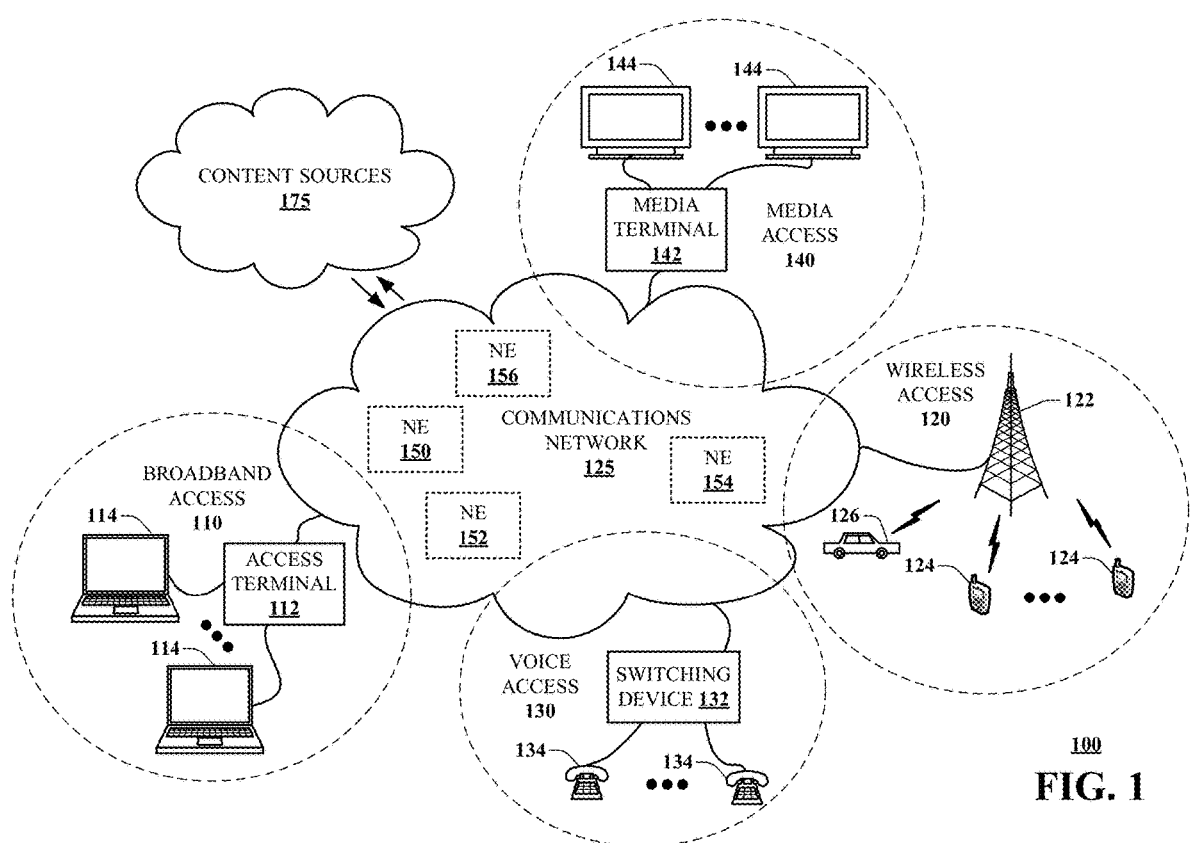
FIG. 1 is a block diagram illustrating an example, non-limiting embodiment of a communications network in accordance with various aspects described herein.

The subject disclosure describes, among other things, illustrative embodiments can include a redox battery system. The redox battery system comprises a three dimensional array of a plurality of nano-batteries. Further embodiments can include a hydrogen power system. The hydrogen power system comprises a nano-array of hydrogen paper, a heat source and a water source, wherein the hydrogen paper is configured to attract hydrogen from the water source. Additional embodiments can include a solar power system. The solar power system comprises an array of a plurality of nano-solar cells. Also, embodiments can include an ionic diode power system. The ionic diode power system comprises two electrodes separated by a polycarbonate membrane, two borophene electric charge capture devices, and a capacitor stack. Further embodiments can include a power supply controller comprising a processing system including a processor; and a memory that stores executable instructions that, when executed by the processing system, facilitate performance of operations. The operations can include providing power to a linear amplifier using the redox battery system. Further operations can include causing recharging of the redox battery system utilizing the hydrogen power system, the solar power system, the ionic diode power system, or a combination thereof, to provide charge to the redox battery system. Other embodiments are described in the subject disclosure.

One or more aspects of the subject disclosure include a system. The can comprise a redox battery system. The redox battery system comprises a three dimensional array of a plurality of nano-batteries. Further, the system can include a hydrogen power system. The hydrogen power system comprises a nano-array of hydrogen paper, a heat source and a water source. The hydrogen paper is configured to attract hydrogen from the water source. In addition, the system can include a solar power system. The solar power system comprises an array of a plurality of nano-solar cells. Also, the system can include an ionic diode power system. The ionic diode power system comprises two electrodes separated by a polycarbonate membrane, two borophene electric charge capture devices, and a capacitor stack. Further, the system can include a power supply controller comprising a processing system including a processor, and a memory that stores executable instructions that, when executed by the processing system, facilitate performance of operations, the operations. The operations can include providing power to a linear amplifier using the redox battery system. Further operations can include causing recharging of the redox battery system utilizing the hydrogen power system, the solar power system, the ionic diode power system, or a combination thereof, to provide charge to the redox battery system.

One or more aspects of the subject disclosure include a non-transitory, machine-readable medium, comprising executable instructions that, when executed by a processing system including a processor, facilitate performance of operations. Operations can include monitoring charge of a redox battery system. Further operations can include detecting the charge is below a predetermined threshold based on the monitoring. Additional operations can include detecting an amount of hydrogen on a portion of hydrogen paper in a hydrogen power system. Also, operations can include determining an amount of sunlight according to a plurality of sensors. A solar power system comprises the plurality of sensors. Further operations can include causing recharging of the redox battery system according to the amount of hydrogen and amount of sunlight. The recharging of the redox battery system is performed by utilizing the hydrogen power system, the solar power system, an ionic diode power system, or a combination thereof.

One or more aspects of the subject disclosure include a method. The method can include detecting, by a processing system including a processor, an amount of hydrogen on a portion of hydrogen paper in a hydrogen power system. Further, the method can include determining, by the processing system, an amount of sunlight according to a plurality of sensors. A solar power system comprises the plurality of sensors. In addition, the method can include causing, by the processing system, recharging of a redox battery system according to the amount of hydrogen and amount of sunlight in response to detecting that a charge of a redox battery system is below a predetermined threshold. The recharging of the redox battery system is performed by utilizing the hydrogen power system, the solar power system, an ionic diode power system, or a combination thereof.

Referring now to FIG. 1, a block diagram is shown illustrating an example, non-limiting embodiment of a communications network 100 in accordance with various aspects described herein. In one or more embodiments, the communications network 100 can include a linear amplifier that is provided power by a redox battery system. In addition, a hydrogen power system, a solar power system, and an ionic diode power system can replenish charge for the redox battery system. Further, a power supply controller communicatively coupled to the redox battery system, the hydrogen power system, the solar power system, and the ionic diode power system. Also, the power supply controller controls, adjusts, manages, regulates, causes to provide and/or provides power to the linear amplifier from the redox power system and controls, adjusts, manages, regulates, causes to provide and/or provides charge from one or more of the hydrogen power system, the solar power system, and the ionic diode power system.

In particular, a communications network 125 is presented for providing broadband access 110 to a plurality of data terminals 114 via access terminal 112, wireless access 120 to a plurality of mobile devices 124 and vehicle 126 via base station or access point 122, voice access 130 to a plurality of telephony devices 134, via switching device 132 and/or media access 140 to a plurality of audio/video display devices 144 via media terminal 142. In addition, communication network 125 is coupled to one or more content sources 175 of audio, video, graphics, text and/or other media. While broadband access 110, wireless access 120, voice access 130 and media access 140 are shown separately, one or more of these forms of access can be combined to provide multiple access services to a single client device (e.g., mobile devices 124 can receive media content via media terminal 142, data terminal 114 can be provided voice access via switching device 132, and so on).

The communications network 125 includes a plurality of network elements (NE) 150, 152, 154, 156, etc. for facilitating the broadband access 110, wireless access 120, voice access 130, media access 140 and/or the distribution of content from content sources 175. The communications network 125 can include a circuit switched or packet switched network, a voice over Internet protocol (VoIP) network, Internet protocol (IP) network, a cable network, a passive or active optical network, a 4G, 5G, or higher generation wireless access network, WIMAX network, UltraWideband network, personal area network or other wireless access network, a broadcast satellite network and/or other communications network.

In various embodiments, the access terminal 112 can include a digital subscriber line access multiplexer (DSLAM), cable modem termination system (CMTS), optical line terminal (OLT) and/or other access terminal. The data terminals 114 can include personal computers, laptop computers, netbook computers, tablets or other computing devices along with digital subscriber line (DSL) modems, data over coax service interface specification (DOCSIS) modems or other cable modems, a wireless modem such as a 4G, 5G, or higher generation modem, an optical modem and/or other access devices.

In various embodiments, the base station or access point 122 can include a 4G, 5G, or higher generation base station, an access point that operates via an 802.11 standard such as 802.11n, 802.11ac or other wireless access terminal. The mobile devices 124 can include mobile phones, e-readers, tablets, phablets, wireless modems, and/or other mobile computing devices.

In various embodiments, the switching device 132 can include a private branch exchange or central office switch, a media services gateway, VoIP gateway or other gateway device and/or other switching device. The telephony devices 134 can include traditional telephones (with or without a terminal adapter), VoIP telephones and/or other telephony devices.

In various embodiments, the media terminal 142 can include a cable head-end or other TV head-end, a satellite receiver, gateway or other media terminal 142. The display devices 144 can include televisions with or without a set top box, personal computers and/or other display devices.

In various embodiments, the content sources 175 include broadcast television and radio sources, video on demand platforms and streaming video and audio services platforms, one or more content data networks, data servers, web servers and other content servers, and/or other sources of media.

In various embodiments, the communications network 125 can include wired, optical and/or wireless links and the network elements 150, 152, 154, 156, etc. can include service switching points, signal transfer points, service control points, network gateways, media distribution hubs, servers, firewalls, routers, edge devices, switches and other network nodes for routing and controlling communications traffic over wired, optical and wireless links as part of the Internet and other public networks as well as one or more private networks, for managing subscriber access, for billing and network management and for supporting other network functions.

Figure 2A:
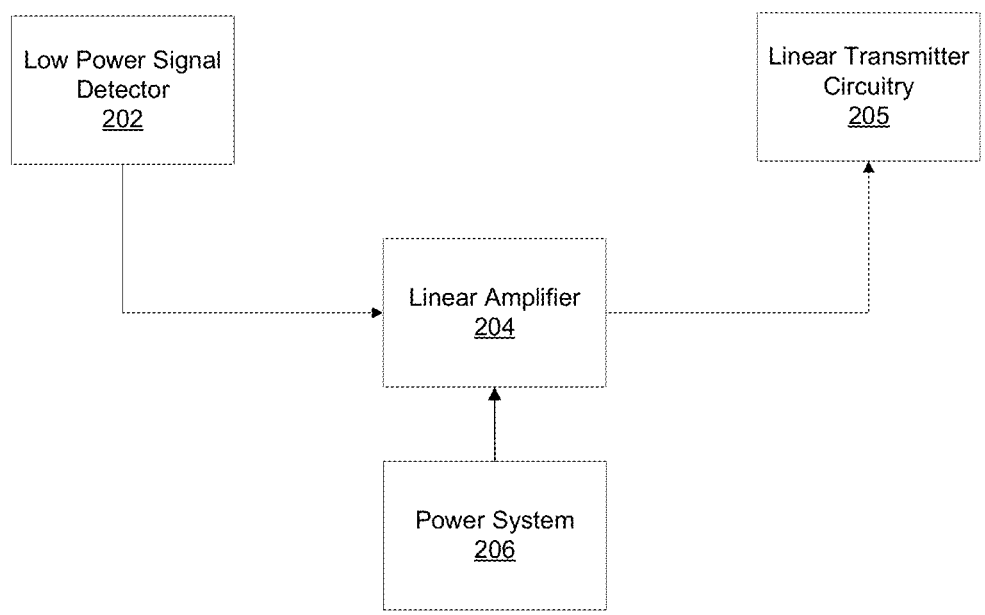
FIGS. 2A-2I is a block diagram illustrating an example, non-limiting embodiment of a system functioning within the communication network of FIG. 1 in accordance with various aspects described herein.

FIGS. 2A-2I is a block diagram illustrating an example, non-limiting embodiment of a system functioning within the communication network of FIG. 1 in accordance with various aspects described herein. Referring to FIG. 2A, in one or more embodiments, the system 200 includes a low power signal detector 202, a linear amplifier 204, a linear transmitter circuitry 205, and a power system 206 that provide s power to the linear amplifier. The system 200 can be located in telecommunication, cellular, or data networks. In some embodiments, the system 200 can be for a cellular network such that the low power signal detector 202 receives an orthogonal frequency-division multiplexing (OFDM) signal, as used in some cellular networks. In further embodiments, the low power signal detector determines whether the power of the OFDM signal is below a predetermined threshold. If so, the OFDM signal can be provided to the linear amplifier 204. In addition, the linear amplifier 204 amplifies the OFDM signal resulting in an amplified OFDM signal. Also, the linear amplifier 204 can provide the amplified OFDM signal to the linear transmitter circuitry 205. Further, the linear transmitter circuitry can provide the amplified OFDM signal to another network element in the cellular network, accordingly.

In one or more embodiments, the linear amplifier 204 is provided power by the power system 206. In some embodiments, the power system 206 can draw power from an electric grid to provide power to the linear amplifier 204. In other embodiments, the linear amplifier may be located in a remote premises located in an area that is not equipped to draw power from the electric grid. Thus, in such a remote premises the power system 206 may be a self-generating or self-charging power system as described herein. In some embodiments, a self-generating or self-charging power system can be incorporated in the power system 206 even though the power system 206 can draw power from an electric grid. In such embodiments, the self-generating or self-charging power system can be a back-up power system to the linear amplifier in situations the electric grid is not functioning or access to the electric grid is impaired.

Figure 2B:
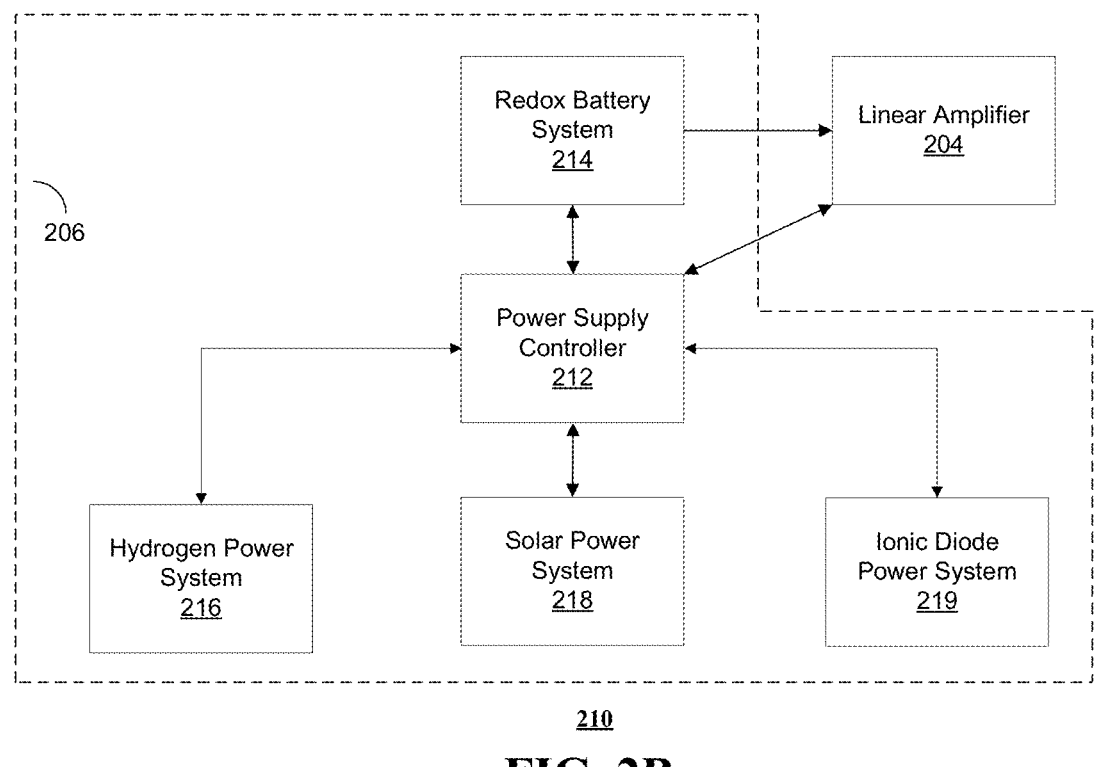

Referring to FIG. 2B, the system 210 include a power system 206 as shown in FIG. 2A. In one or more embodiments, the system 210 can include a power supply controller 212, a redox battery system 214, a hydrogen power system 216, a solar power system 218, and an ionic diode power system 219. In some embodiments, the power supply controller 212 can controls, adjust, manage, regulate, cause to provide and/or provide power from the redox battery system 214 to a linear amplifier 204. In other embodiments, the power supply controller 212 can provide power to the linear amplifier 204 solely from the redox battery system because the linear amplifier 204 is located in a remote premises without the capability to access power from an electric grid. In other embodiments, the power supply controller 212 can provide the linear amplifier 204 with power either from an electric grid or from the redox power system 214. In such embodiments, the redox battery system 214 can be operated as a back-up power system to the electric grid for situations in which the electric grid cannot provide power to the linear amplifier 204.

In one or more embodiments, a redox battery system can also be called a reduction-oxidation battery in which charge is collected from ions flowing from an anolyte chemical liquid to a catholyte chemical liquid. The anolyte and catholyte are separated by an ion-selective membrane to induce charge collection.

In one or more embodiments, the linear amplifier 204 can deplete charge from the redox battery system. Charge can be replaced using one or more of the hydrogen power system 212, solar power system 218, and/or ionic diode power system. The power supply controller controls, adjusts, manages, regulates, causes to provide and/or provides charge from one, some or all of the hydrogen power system 216, solar power system 218, and ionic diode power system 219. In some embodiments, the power supply controller can monitor the charge of the redox battery system 214 and detects that the charge of the battery redox battery system is below a predetermined threshold. In response, the power supply controller 212 can cause the recharging of the redox battery system 214 from one, some, or all of the hydrogen power system 216, solar power system 218, and ionic diode power system 219. The power supply controller 212 can select one, some, or all of the hydrogen power system 216, solar power system 218, and ionic diode power system 219 depending on whether their own resources (e.g. amount of hydrogen, amount of sunlight), etc. is available, as described herein.

Figure 2C:
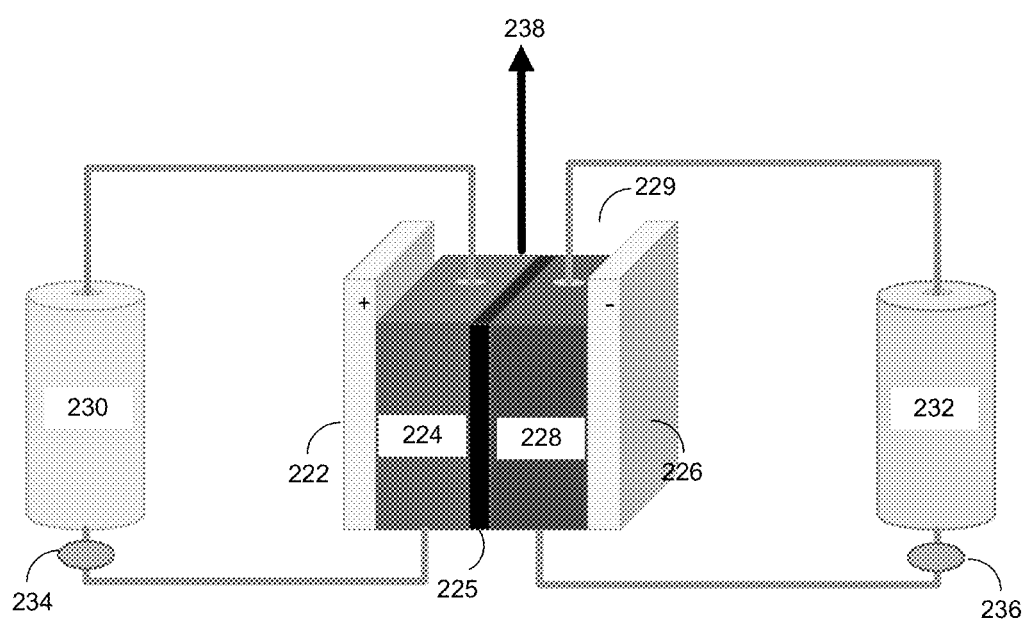

Referring to FIG. 2C, in one or more embodiments, a redox battery system 220 can comprise several components that include a reservoir tank of anolyte 230 and a reservoir or tank of catholyte 232. An example of anolyte can be pyridinium and an example of catholyte can be iodide. The anolyte from the tank 230 and the catholyte from the tank 232 can be provided to a nanocell 229 (i.e. nano-battery) using pumps 234, 236. Each nanocell 229 can comprise a positive electrode 222 proximate to an area filled with anolyte 224 as well as a negative electrode 226 proximate to an area filled with catholyte 228. The anolyte 224 and catholyte 228 are separated by a membrane 225. Ions flow between the anolyte 224 portion of the cell and the catholyte 228 portion of the cell inducing charge and/or power 238 that is provided to the power supply controller 212, which provides the power to the linear amplifier 204. In further embodiments, the redox battery system 214 can comprise multiple nanocells 229 (i.e. nano-batteries) to provide power to the linear amplifier 204. As the charge is depleted by the redox battery system 220 in one the anolyte 230 or catholyte 232 reservoirs or tanks, the charge is replaced using one or more of hydrogen power system 216, solar power system 218, and ionic diode system 219.

Figure 2D:
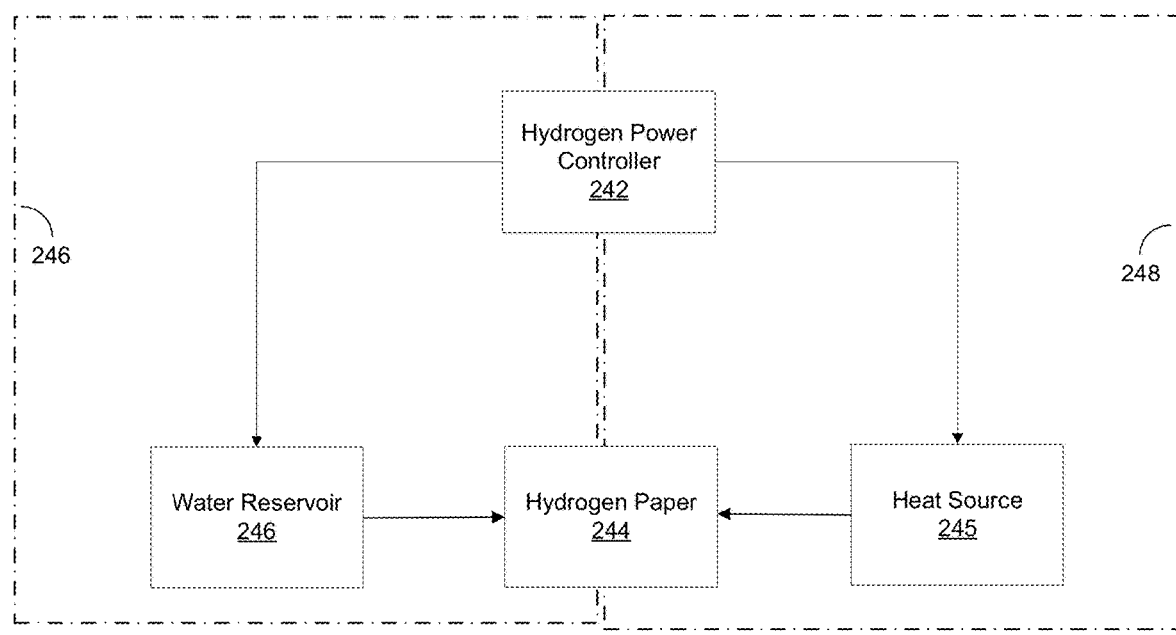

Referring to FIG. 2D, in one or more embodiments, the system 240 is an embodiment of a hydrogen power system 216. The system 240 can comprise several components including a hydrogen power controller 242, a heat source 245, a water reservoir 256, and hydrogen paper 244. Further, the hydrogen power controller 242, heat source 245, and hydrogen paper 244 comprise the hydrogen release components 248 of the system 240. In addition, the hydrogen power controller 242, water reservoir 256, and hydrogen paper 244 comprise the hydrogen capture components 246 of the system 240.

In one or more embodiments, the hydrogen power controller 242 detects the charge of the redox battery system 214 is below a predetermined threshold. Further, the hydrogen power controller 242 activates the heat source 245 to be applied to the hydrogen paper 244 in response to detecting the charge of the redox battery system 214 falling below a predetermined threshold. The heat from the heat source 245 release hydrogen from the hydrogen paper 244. The hydrogen is provided to the hydrogen power controller 242, which provides the hydrogen to the redox battery system 214 to replenish its charge.

In one or more embodiments, the hydrogen power controller 242 can detect that the hydrogen level of the hydrogen paper 244 falls below a predetermined threshold. In response, the hydrogen power controller 242 can release water from the water reservoir 256 to replenish the hydrogen on the hydrogen paper 244. In some embodiments, the hydrogen paper can be a ketone polymer sheet enriched with nanoplate catalysts that can pull or attract hydrogen from the water when the ketone polymer sheet is exposed to water.

In one or more embodiments, the power supply controller can monitor the amount of hydrogen attached to the hydrogen paper and/or the amount of water in the water reservoir 256 and determine that there is not enough resources to provide charge to the redox battery system 214 for a period of time and select one of the sunlight power system 218 and ionic diode power system 219 to provide charge to the redox battery system to replenish its supply. In one or more embodiments, the hydrogen paper can be other types of hydrogen paper or other elements that facilitate supplying hydrogen as described herein.

Figure 2E:
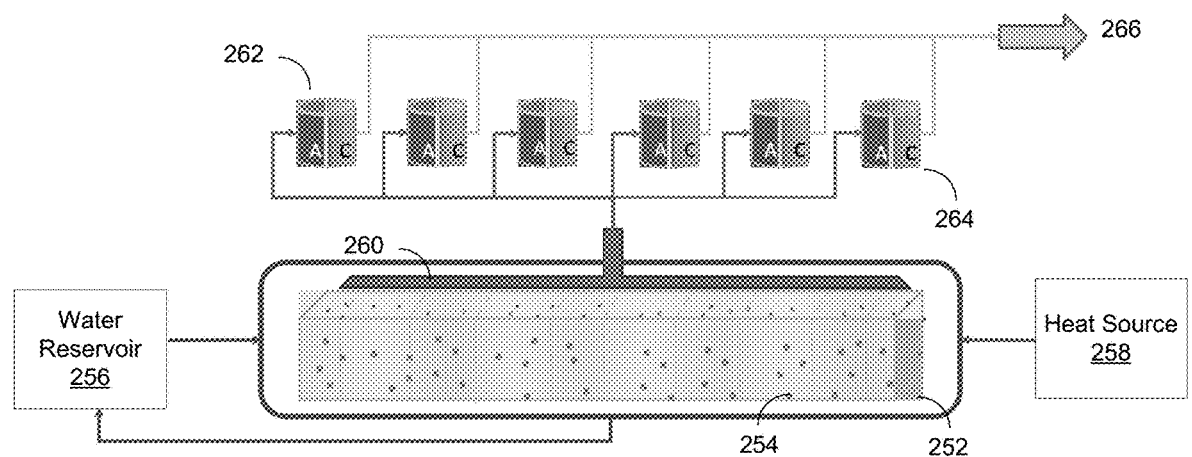

Referring to FIG. 2E, in one or more embodiments, the system 250 can include an embodiment of the hydrogen power system 216 as shown in FIG. 2B. The system 250 can comprise several components including a water reservoir 256, and heat source 258, a hydrogen paper nano-array 252 (each portion or cell of the hydrogen paper nano-array 252 can include nanoplate catalysts 254), and a hydrogen gas collector 260. The hydrogen gas collector can provide hydrogen to one or more nanocells. Each nanocell can include anode 262 and a cathode 264. The hydrogen gas collector 260 provides hydrogen to the anode of one or more nanocells to replenish or provide the charge 266 to the redox battery system.

Figure 2F:
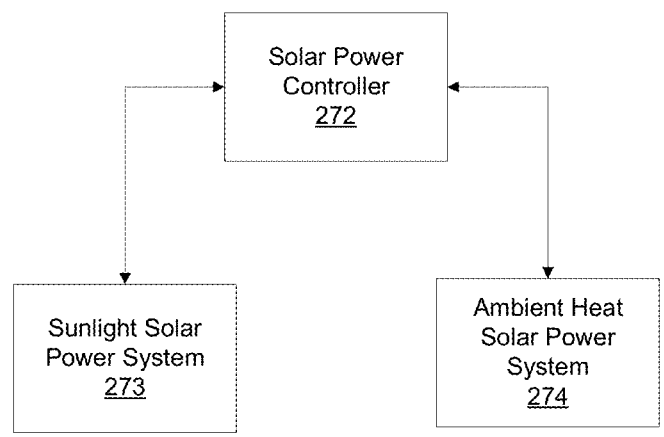

Referring to FIG. 2F, in one or more embodiments, system 270 can include an embodiment of the solar power system 218. In some embodiments, the system 270 can include a solar power controller 272, a sunlight solar power system 273, and an ambient heat solar power system 274. In other embodiments, the system 270 can include only one of the sunlight solar power system 273 and the ambient heat solar power system 274. The solar power controller 272 can receive charge from one or both of the sunlight solar power system 273 and/or ambient heat solar power system 274 and provide the charge to the redox battery system 214 to replenish charge provided as power to the linear amplifier 204.

Figure 2G:
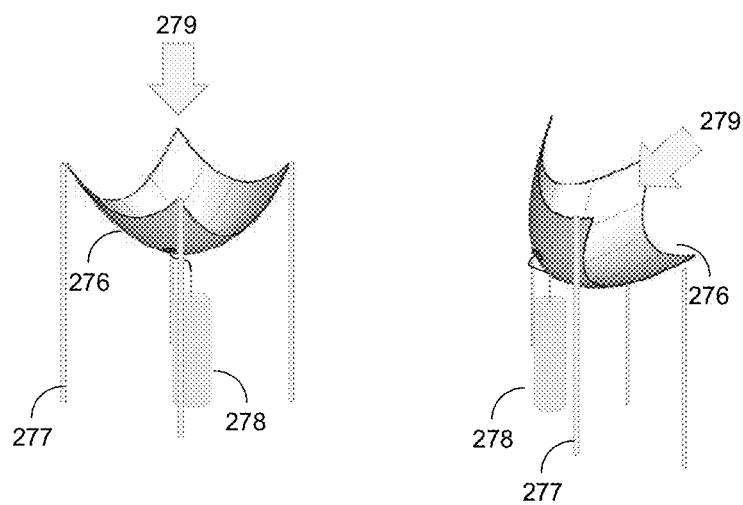

Referring to FIG. 2G, in one or more embodiments, the system 275 can be an embodiment of a sunlight solar power system 273. The system 275 can comprise one or more nano-solar cells each of which comprising a flexible Perovskite photovoltaic solar cell 276, each flexible Perovskite photovoltaic solar cell 276 coupled to one or more risers 277, and each flexible Perovskite photovoltaic solar cell 276 coupled to a charge collector 278. The risers 277 orient each flexible Perovskite photovoltaic solar cell 276 toward the direction of the sun to collect sunlight 279. In some embodiments, the risers 277 are communicatively coupled to sensors to detect the orientation of the sunlight. If the sensors detect a change in the orientation of the sun, actuators coupled to the risers 277 are operated to orient the flexible Perovskite photovoltaic solar cell 276 toward the direction of the sun to continue to collect sunlight 279. Hence, the risers actuate in an inversely phototrophic manner. Further, the flexible Perovskite photovoltaic solar cell 276 captures sunlight 279 and converts it to electric charge, which is stored in charge collector 278. Charge from the charge collector 278 are provided to the solar power controller 272, which then can send the charge to the redox battery 214 to replenish its supply.

In one or more embodiments, the sensors of the risers 277 can detect that the orientation of the sun is overhead. Thus, all risers 277 for the flexible Perovskite photovoltaic solar cell 276 are actuated to a high level so that the flexible Perovskite photovoltaic solar cell 276 can collect sunlight 279. In another embodiment, the sensors of the risers 277 can detect that the orientation of the sun is at an angle. Hence, two of the risers 277 for the flexible Perovskite photovoltaic solar cell 276 are actuated to a high level and two risers 277 are actuated to a low level to orient the all risers 277 for the flexible Perovskite photovoltaic solar cell 276 so that the flexible Perovskite photovoltaic solar cell 276 can collect sunlight 279 at an angle.

In one or more embodiments, the risers can be actuated according to the time of day. For example, if the time of day is around 12 noon, it may be likely the orientation of the sun is directly overhead. Thus, all risers 277 for the flexible Perovskite photovoltaic solar cell 276 are actuated to a high level so that the flexible Perovskite photovoltaic solar cell 276 can collect sunlight 279. In a further embodiment, if the time of day is around 3 pm, it may be likely that the sun is at angle. Hence, two of the risers 277 for the flexible Perovskite photovoltaic solar cell 276 are actuated to a high level and two risers 277 are actuated to a low level to orient the all risers 277 for the flexible Perovskite photovoltaic solar cell 276 so that the flexible Perovskite photovoltaic solar cell 276 can collect sunlight 27 at an angle.

In one or more embodiments, the power supply controller can monitor the amount of sunlight using the sensors or detecting the amount of charge collected by the charge collectors 278 (e.g. the amount of charge collected by charge collectors 278 is not above a predetermined threshold). If the power supply controller 212 determines that the amount of collected charge or amount of sunlight is not above a predetermined threshold, then the power supply controller 212 can determine that there is not enough resources to provide charge to the redox battery system 214 for a period of time and select one of the hydrogen power system 216 and ionic diode power system 219 to provide charge to the redox battery system to replenish its supply.

Figure 2H:
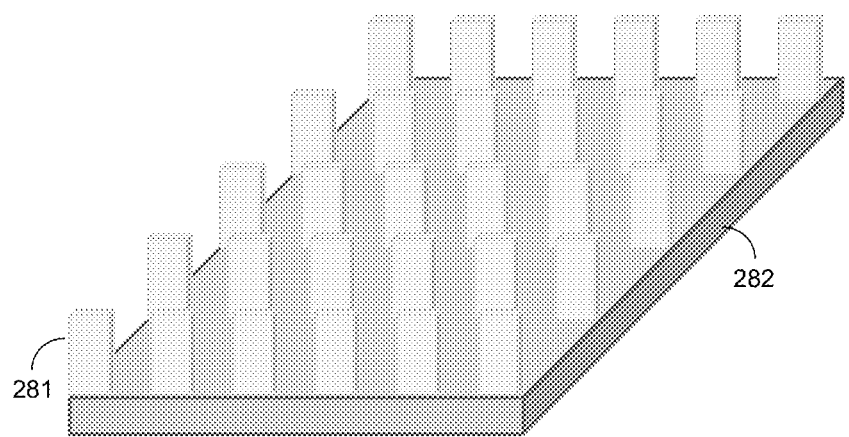

Referring to FIG. 2H, the system 280 can be an embodiment of the ambient heat solar power system 274. The system 280 can comprise a nano-array of Perovskite photovoltaic solar cell 281, each of which stands perpendicular to a semiconductor 282. Each Perovskite photovoltaic solar cell 281 captures heat (i.e. infrared light). The semiconductor generates charge due to each of the Perovskite photovoltaic solar cells 281 collecting heat. The charge can provided to the solar power controller 272, which then can send the charge to the redox battery 214 to replenish its supply. In some embodiments, the height, spacing, or radii of each Perovskite photovoltaic solar cell can be adjusted according to the target bandwidth of the infrared light to increase collection of charge. In other embodiments, the size or dimensions of the semiconductor 282 can be adjusted according to the target bandwidth of the infrared light to focus the infrared light onto the Perovskite photovoltaic solar cells 281.

Figure 2I:
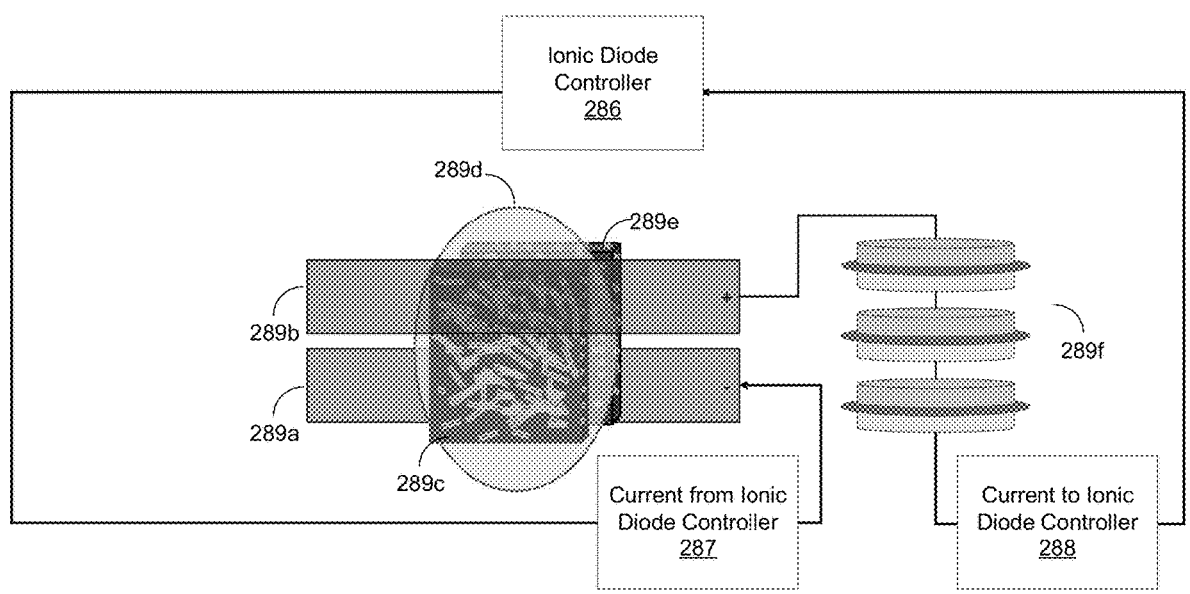

Referring to FIG. 2I, in one or more embodiments, the system 285 can be an embodiment of the ionic diode power system 219. An ionic diode power system 219 can harness the energy of vibrations using a flexible ionic diode. The system 285 can comprise several components that can include ionic diode controller 286, electric charge collectors 289*a*, 289*b*, nanocomposite electrodes 289*c*, 289*e* separated by a membrane 289*d*, and a capacitor stack 289*f*. In some embodiments, the charge collectors 289*a*, 289*b* can comprise borophene. In other embodiments, one electrode 289*c* can be a group of liquid positive ions and another electrode 289*e* can be a group of liquid negative ions. Ions travel between the electrodes 289*c*, 289*e* across the membrane 289 inducing charge to be collected into the capacitor stack 289*f*. In some embodiments the membrane 289*d* can comprise a polycarbonate membrane. Charge stored in the capacitor stack 289*f* can discharged to be provided as current 288 to the ionic diode controller 286. Further, the ionic diode controller 286 can provide the charge from the current to the redox battery system 214 to replenish its supply. In other embodiments, the ionic diode controller can provide current 287 to the one or both charge collectors 289*a*, 289*b* to replenish the ions of one or both of the electrodes 289*c*, 289*e* to sustain the operation of the ionic diode.

Figure 2J:
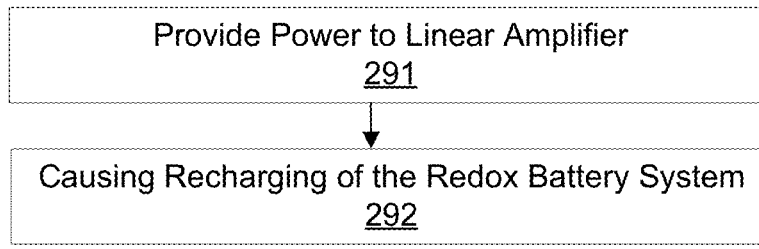
FIGS. 2J-2K depicts illustrative embodiments of methods in accordance with various aspects described herein.
Figure 2K:
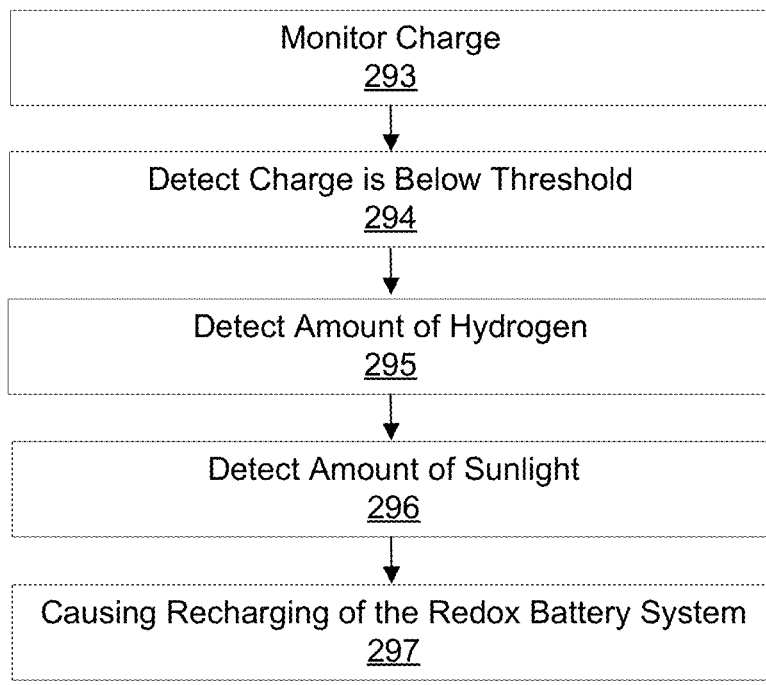

FIGS. 2J-2K depicts illustrative embodiments of methods in accordance with various aspects described herein. Referring to FIG. 2J, the method 290 can be implemented by any of the devices described herein including a power supply controller. Further, the method 290 can include, at 291, the power supply controller providing power to a linear amplifier using a redox battery system. In addition, the method 290 can include, at 292, the power supply controller causing recharging of the redox battery system utilizing the hydrogen power system, the solar power system, the ionic diode power system, or a combination thereof, to provide charge to the redox battery system.

In one or more embodiments, the redox battery system comprises a three dimensional array of a plurality of nano-batteries. Each of the plurality of nano-batteries comprises an anode and a cathode separated by a membrane wherein each anode of each of the plurality of nano-batteries receives an anolyte from a first reservoir, wherein each cathode of each of the plurality of nano-batteries receives a catholyte from a second reservoir. Further, the anolyte can comprise pyridinium and the catholyte can comprise iodide.

In one or more embodiments, the hydrogen power system comprises a nano-array of hydrogen paper, a heat source and a water source, wherein the hydrogen paper is configured to attract hydrogen from the water source. The charge is generated in response to the hydrogen being captured from the hydrogen paper in response to the heat source being activated and applied to the hydrogen paper. Each cell of the nano-array of hydrogen paper comprises a nanoplate catalyst that provides the hydrogen to a hydrogen collector. Further, the hydrogen collector provides the hydrogen to each of a plurality of anode-cathode pairs. A portion of the charge is collected from at least one of the plurality of anode-cathode pairs.

In one or more embodiments, the solar power system comprises an array of a plurality of nano-solar cells. Each of the plurality of nano-solar cells comprise a Perovskite solar cell resulting in a plurality of Perovskite solar cells. Further, each of the plurality of Perovskite solar cells is coupled to a riser resulting in a plurality of risers, wherein adjusting a riser of the plurality of risers adjusts an orientation of a Perovskite solar cell of the plurality of Perovskite solar cells. In some embodiments, the adjusting of the riser of the plurality of risers comprises adjusting the riser of the plurality of risers in response to determining a time of day. In other embodiments, the adjusting of the riser of the plurality of risers comprises adjusting the riser of the plurality of risers in response to determining a change in orientation of sunlight. Also, each Perovskite solar cell of the plurality of Perovskite solar cells is coupled to a charge collector resulting in a plurality of charge collectors, wherein a portion of the charge is collected from at least one of the plurality of charge collectors.

In additional embodiments, the plurality of Perovskite solar cells are arranged in a two dimensional array on a semiconductor, wherein each of the plurality of Perovskite solar cells captures ambient heat to heat a first side of the semiconductor. A portion of the charge is collected from the semiconductor.

In one or more embodiments, the ionic diode power system comprises two electrodes separated by a polycarbonate membrane, two borophene electric charge capture devices, and a capacitor stack. A portion of the charge is collected from ion flow between the two electrodes through the polycarbonate membrane by the two borophene electric charge devices. The portion of the charge is stored in the capacitor stack. The portion of the charge is provided by the capacitor stack in response to discharging the capacitor stack Referring to FIG. 2K, the method 299 can be implemented by any of the devices described herein including a power supply controller. The method 299 can include, at 293, the power supply controller monitoring charge of a redox battery system. Further, the method 299 can include, at 294, the power supply controller detecting the charge is below a predetermined threshold based on the monitoring. In addition, the method 299 can include, at 295, the power supply controller detecting an amount of hydrogen on a portion of hydrogen paper in a hydrogen power system. Also, the method 299 can include, at 296, the power supply controller determining an amount of sunlight according to a plurality of sensors, wherein a solar power system comprises the plurality of sensors. Further, the method 299 can include, at 294, the power supply controller causing recharging of the redox battery system according to the amount of hydrogen and amount of sunlight, wherein the recharging of the redox battery system is performed by utilizing the hydrogen power system, the solar power system, an ionic diode power system, or a combination thereof.

In one or more embodiments, the power supply controller can not only select a particular recharging source/system or combination of sources/system (e.g. hydrogen power system, solar power system, ionic diode power system), but also regulates that amount of charging from the source/system. For example, a solar system collects an amount of charge from the amount of sunlight that does not rise above a predetermined threshold. The hydrogen power system includes enough hydrogen attached to the hydrogen paper but is below a predetermined threshold for the amount of hydrogen such that the hydrogen can be depleted in a short amount of time. Thus, the power supply controller can use the combination of the solar power system and the hydrogen power system to recharge the redox battery system to prolong the depletion of the hydrogen attached to the hydrogen paper. Therefore, the power supply can detect the amount of resources (e.g. sunlight, water, hydrogen, etc.) available from the self-charging power systems (e.g. hydrogen power system, solar power system, ionic diode power system, etc.) and determine to select one or more of the self-charging power systems to prolong the depletion of the amount of resources available.

While for purposes of simplicity of explanation, the respective processes are shown and described as a series of blocks in FIGS. 2J and 2K, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Further, portions of embodiments described herein can be combined with portions of other embodiments. In addition, embodiments can be separated and implemented stand alone.

Figure 3:
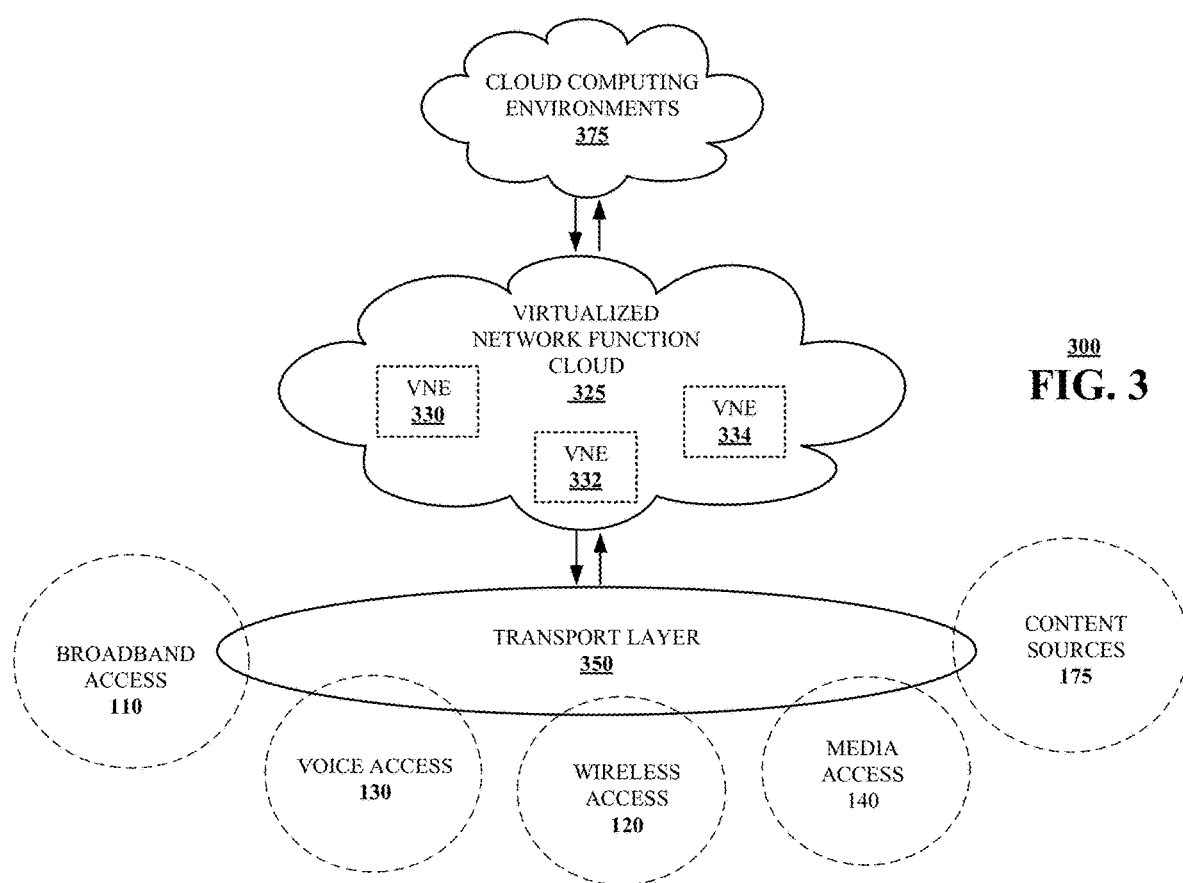
FIG. 3 is a block diagram illustrating an example, non-limiting embodiment of a virtualized communication network in accordance with various aspects described herein.

Referring now to FIG. 3, a block diagram 300 is shown illustrating an example, non-limiting embodiment of a virtualized communication network in accordance with various aspects described herein. In particular a virtualized communication network is presented that can be used to implement some or all of the subsystems and functions of communication network 100, the subsystems and functions of system 200, and methods 290 and 299 presented in FIGS. 1, 2A-2K.

In one or more embodiments, the networks shown in FIG. 3 can include a linear amplifier that is provided power by a redox battery system. In addition, a hydrogen power system, a solar power system, and an ionic diode power system can replenish charge for the redox battery system. Further, a power supply controller communicatively coupled to the redox battery system, the hydrogen power system, the solar power system, and the ionic diode power system. Also, the power supply controller controls, adjusts, manages, regulates, causes to provide and/or provides power to the linear amplifier from the redox power system and controls, adjusts, manages, regulates, causes to provide and/or provides charge from one or more of the hydrogen power system, the solar power system, and the ionic diode power system.

In particular, a cloud networking architecture is shown that leverages cloud technologies and supports rapid innovation and scalability via a transport layer 350, a virtualized network function cloud 325 and/or one or more cloud computing environments 375. In various embodiments, this cloud networking architecture is an open architecture that leverages application programming interfaces (APIs); reduces complexity from services and operations; supports more nimble business models; and rapidly and seamlessly scales to meet evolving customer requirements including traffic growth, diversity of traffic types, and diversity of performance and reliability expectations.

In contrast to traditional network elements—which are typically integrated to perform a single function, the virtualized communication network employs virtual network elements (VNEs) 330, 332, 334, etc. that perform some or all of the functions of network elements 150, 152, 154, 156, etc. For example, the network architecture can provide a substrate of networking capability, often called Network Function Virtualization Infrastructure (NFVI) or simply infrastructure that is capable of being directed with software and Software Defined Networking (SDN) protocols to perform a broad variety of network functions and services. This infrastructure can include several types of substrates. The most typical type of substrate being servers that support Network Function Virtualization (NFV), followed by packet forwarding capabilities based on generic computing resources, with specialized network technologies brought to bear when general purpose processors or general purpose integrated circuit devices offered by merchants (referred to herein as merchant silicon) are not appropriate. In this case, communication services can be implemented as cloud-centric workloads.

As an example, a traditional network element 150 (shown in FIG. 1), such as an edge router can be implemented via a VNE 330 composed of NFV software modules, merchant silicon, and associated controllers. The software can be written so that increasing workload consumes incremental resources from a common resource pool, and moreover so that it's elastic: so the resources are only consumed when needed. In a similar fashion, other network elements such as other routers, switches, edge caches, and middle-boxes are instantiated from the common resource pool. Such sharing of infrastructure across a broad set of uses makes planning and growing infrastructure easier to manage.

In an embodiment, the transport layer 350 includes fiber, cable, wired and/or wireless transport elements, network elements and interfaces to provide broadband access 110, wireless access 120, voice access 130, media access 140 and/or access to content sources 175 for distribution of content to any or all of the access technologies. In particular, in some cases a network element needs to be positioned at a specific place, and this allows for less sharing of common infrastructure. Other times, the network elements have specific physical layer adapters that cannot be abstracted or virtualized, and might require special DSP code and analog front-ends (AFEs) that do not lend themselves to implementation as VNEs 330, 332 or 334. These network elements can be included in transport layer 350.

The virtualized network function cloud 325 interfaces with the transport layer 350 to provide the VNEs 330, 332, 334, etc. to provide specific NFVs. In particular, the virtualized network function cloud 325 leverages cloud operations, applications, and architectures to support networking workloads. The VNEs 330, 332 and 334 can employ network function software that provides either a one-for-one mapping of traditional network element function or alternately some combination of network functions designed for cloud computing. For example, VNEs 330, 332 and 334 can include route reflectors, domain name system (DNS) servers, and dynamic host configuration protocol (DHCP) servers, system architecture evolution (SAE) and/or mobility management entity (MME) gateways, broadband network gateways, IP edge routers for IP-VPN, Ethernet and other services, load balancers, distributers and other network elements. Because these elements don't typically need to forward large amounts of traffic, their workload can be distributed across a number of servers—each of which adds a portion of the capability, and overall which creates an elastic function with higher availability than its former monolithic version. These VNEs 330, 332, 334, etc. can be instantiated and managed using an orchestration approach similar to those used in cloud compute services.

The cloud computing environments 375 can interface with the virtualized network function cloud 325 via APIs that expose functional capabilities of the VNEs 330, 332, 334, etc. to provide the flexible and expanded capabilities to the virtualized network function cloud 325. In particular, network workloads may have applications distributed across the virtualized network function cloud 325 and cloud computing environment 375 and in the commercial cloud, or might simply orchestrate workloads supported entirely in NFV infrastructure from these third party locations.

Figure 4:
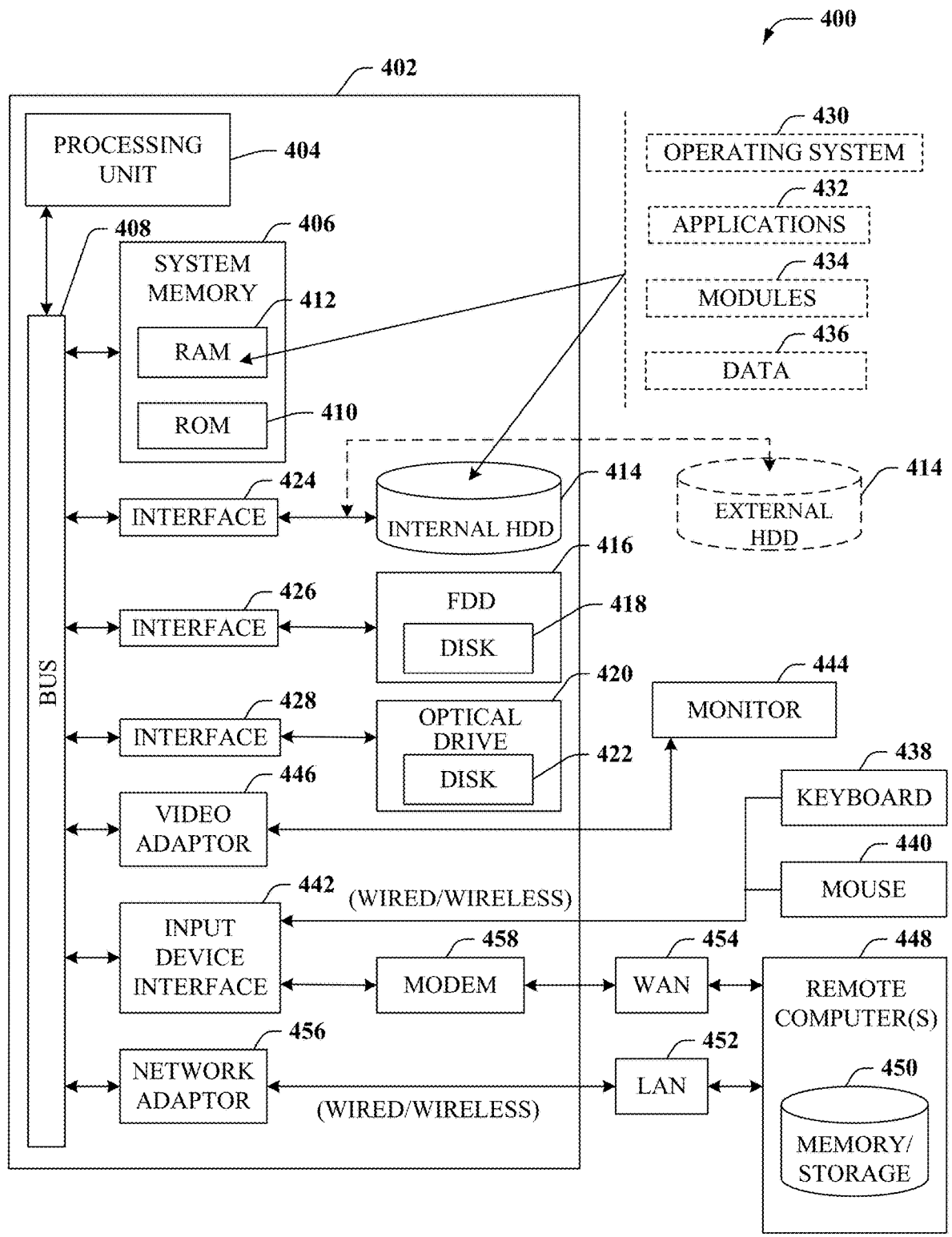
FIG. 4 is a block diagram of an example, non-limiting embodiment of a computing environment in accordance with various aspects described herein.

Turning now to FIG. 4, there is illustrated a block diagram of a computing environment in accordance with various aspects described herein. Aspects of the computing environment can be incorporated in various devices described herein including low power signal detector 202, linear amplifier 204, linear transmitter circuitry 205, power supply controller 212, the redox battery system 214, hydrogen power system 216, solar power system 218, ionic diode power system 219, hydrogen power controller 242, solar power controller 272, sunlight solar power system 273, ambient heat solar power system 274.

In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of network elements 150, 152, 154, 156, access terminal 112, base station or access point 122, switching device 132, media terminal 142, and/or VNEs 330, 332, 334, etc. Each of these devices can be implemented via computer-executable instructions that can run on one or more computers, and/or in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communication network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 5:
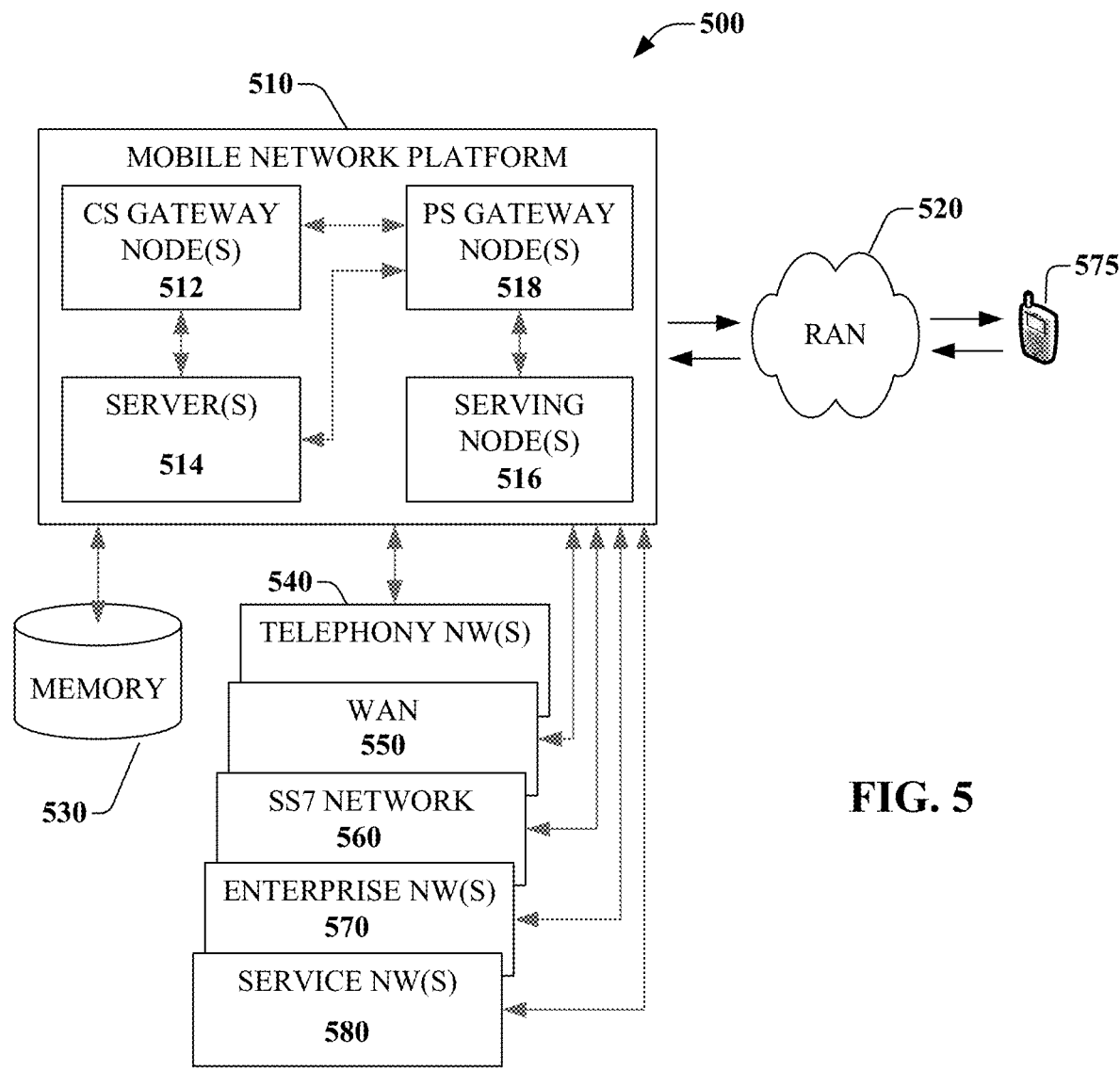
FIG. 5 is a block diagram of an example, non-limiting embodiment of a mobile network platform in accordance with various aspects described herein.

Turning now to FIG. 5, an embodiment 500 of a mobile network platform 510 is shown that is an example of network elements 150, 152, 154, 156, and/or VNEs 330, 332, 334, etc.

In one or more embodiments, the mobile network platform 510 can include a linear amplifier that is provided power by a redox battery system. In addition, a hydrogen power system, a solar power system, and an ionic diode power system can replenish charge for the redox battery system. Further, a power supply controller communicatively coupled to the redox battery system, the hydrogen power system, the solar power system, and the ionic diode power system. Also, the power supply controller controls, adjusts, manages, regulates, causes to provide and/or provides power to the linear amplifier from the redox power system and controls, adjusts, manages, regulates, causes to provide and/or provides charge from one or more of the hydrogen power system, the solar power system, and the ionic diode power system.

In one or more embodiments, the mobile network platform 510 can generate and receive signals transmitted and received by base stations or access points such as base station or access point 122. Generally, mobile network platform 510 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, mobile network platform 510 can be included in telecommunications carrier networks, and can be considered carrier-side components as discussed elsewhere herein. Mobile network platform 510 comprises CS gateway node(s) 512 which can interface CS traffic received from legacy networks like telephony network(s) 540 (e.g., public switched telephone network (PSTN), or public land mobile network (PLMN)) or a signaling system #7 (SS7) network 560. CS gateway node(s) 512 can authorize and authenticate traffic (e.g., voice) arising from such networks. Additionally, CS gateway node(s) 512 can access mobility, or roaming, data generated through SS7 network 560; for instance, mobility data stored in a visited location register (VLR), which can reside in memory 530. Moreover, CS gateway node(s) 512 interfaces CS-based traffic and signaling and PS gateway node(s) 518. As an example, in a 3GPP UMTS network, CS gateway node(s) 512 can be realized at least in part in gateway GPRS support node(s) (GGSN). It should be appreciated that functionality and specific operation of CS gateway node(s) 512, PS gateway node(s) 518, and serving node(s) 516, is provided and dictated by radio technology(ies) utilized by mobile network platform 510 for telecommunication over a radio access network 520 with other devices, such as radiotelephone 575.

In addition to receiving and processing CS-switched traffic and signaling, PS gateway node(s) 518 can authorize and authenticate PS-based data sessions with served mobile devices. Data sessions can comprise traffic, or content(s), exchanged with networks external to the mobile network platform 510, like wide area network(s) (WAN) 550, enterprise network(s) 570, and service network(s) 580, which can be embodied in local area network(s) (LANs), can also be interfaced with mobile network platform 510 through PS gateway node(s) 518. It is to be noted that WAN 550 and enterprise network(s) 570 can embody, at least in part, a service network(s) like IP multimedia subsystem (IMS). Based on radio technology layer(s) available in technology resource(s) of radio access network 520, PS gateway node(s) 518 can generate packet data protocol contexts when a data session is established; other data structures that facilitate routing of packetized data also can be generated. To that end, in an aspect, PS gateway node(s) 518 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 500, mobile network platform 510 also comprises serving node(s) 516 that, based upon available radio technology layer(s) within technology resource(s) in the radio access network 520, convey the various packetized flows of data streams received through PS gateway node(s) 518. It is to be noted that for technology resource(s) that rely primarily on CS communication, server node(s) can deliver traffic without reliance on PS gateway node(s) 518; for example, server node(s) can embody at least in part a mobile switching center. As an example, in a 3GPP UMTS network, serving node(s) 516 can be embodied in serving GPRS support node(s) (SGSN).

For radio technologies that exploit packetized communication, server(s) 514 in mobile network platform 510 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by mobile network platform 510. Data streams (e.g., content(s) that are part of a voice call or data session) can be conveyed to PS gateway node(s) 518 for authorization/authentication and initiation of a data session, and to serving node(s) 516 for communication thereafter. In addition to application server, server(s) 514 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through mobile network platform 510 to ensure network's operation and data integrity in addition to authorization and authentication procedures that CS gateway node(s) 512 and PS gateway node(s) 518 can enact. Moreover, provisioning server(s) can provision services from external network(s) like networks operated by a disparate service provider; for instance, WAN 550 or Global Positioning System (GPS) network(s) (not shown). Provisioning server(s) can also provision coverage through networks associated to mobile network platform 510 (e.g., deployed and operated by the same service provider), such as the distributed antennas networks shown in FIG. 1(s) that enhance wireless service coverage by providing more network coverage.

It is to be noted that server(s) 514 can comprise one or more processors configured to confer at least in part the functionality of mobile network platform 510. To that end, the one or more processor can execute code instructions stored in memory 530, for example. It is should be appreciated that server(s) 514 can comprise a content manager, which operates in substantially the same manner as described hereinbefore.

In example embodiment 500, memory 530 can store information related to operation of mobile network platform 510. Other operational information can comprise provisioning information of mobile devices served through mobile network platform 510, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 530 can also store information from at least one of telephony network(s) 540, WAN 550, SS7 network 560, or enterprise network(s) 570. In an aspect, memory 530 can be, for example, accessed as part of a data store component or as a remotely connected memory store.

In order to provide a context for the various aspects of the disclosed subject matter, FIG. 5, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 6:
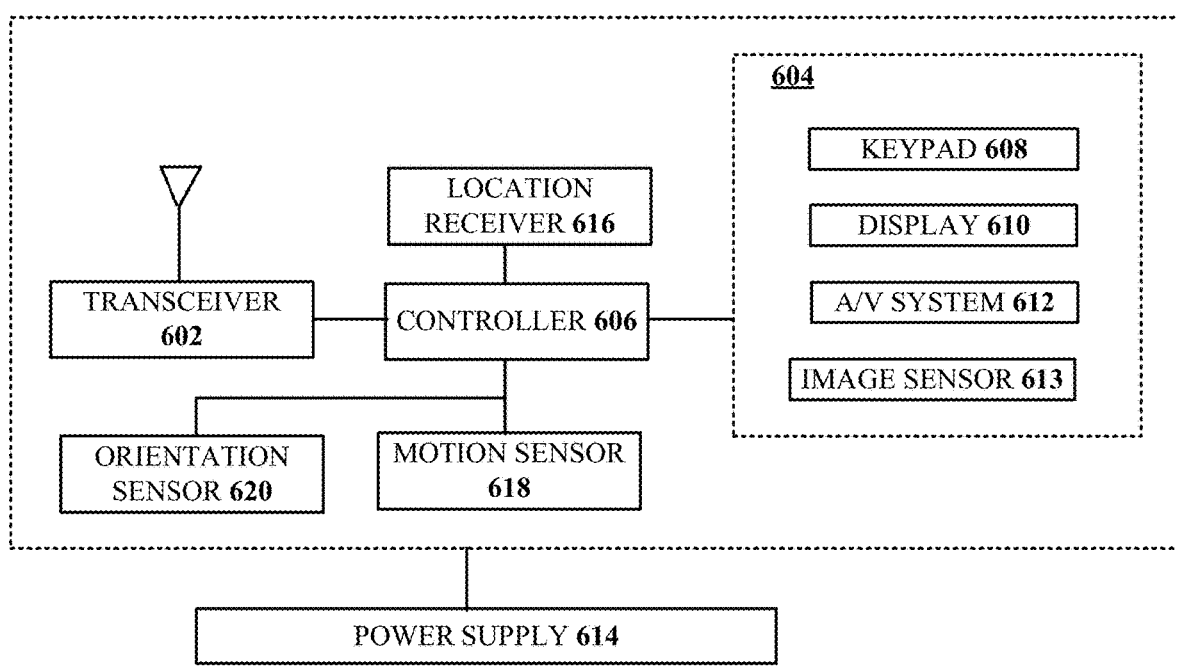
FIG. 6 is a block diagram of an example, non-limiting embodiment of a communication device in accordance with various aspects described herein.

Turning now to FIG. 6, an illustrative embodiment of a communication device 600 is shown. The communication device 600 can serve as an illustrative embodiment of devices such as data terminals 114, mobile devices 124, vehicle 126, display devices 144 or other client devices for communication via either communications network 125. Further, embodiments of the communication device, or portions thereof, can be incorporated in various devices described herein including low power signal detector 202, linear amplifier 204, linear transmitter circuitry 205, power supply controller 212, the redox battery system 214, hydrogen power system 216, solar power system 218, ionic diode power system 219, hydrogen power controller 242, solar power controller 272, sunlight solar power system 273, ambient heat solar power system 274.

The communication device 600 can comprise a wireline and/or wireless transceiver 602 (herein transceiver 602), a user interface (UI) 604, a power supply 614, a location receiver 616, a motion sensor 618, an orientation sensor 620, and a controller 606 for managing operations thereof. The transceiver 602 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The transceiver 602 can also be adapted to support circuit-switched wireline access technologies (such as PSTN), packet-switched wireline access technologies (such as TCP/IP, VoIP, etc.), and combinations thereof.

The UI 604 can include a depressible or touch-sensitive keypad 608 with a navigation mechanism such as a roller ball, a joystick, a mouse, or a navigation disk for manipulating operations of the communication device 600. The keypad 608 can be an integral part of a housing assembly of the communication device 600 or an independent device operably coupled thereto by a tethered wireline interface (such as a USB cable) or a wireless interface supporting for example Bluetooth®. The keypad 608 can represent a numeric keypad commonly used by phones, and/or a QWERTY keypad with alphanumeric keys. The UI 604 can further include a display 610 such as monochrome or color LCD (Liquid Crystal Display), OLED (Organic Light Emitting Diode) or other suitable display technology for conveying images to an end user of the communication device 600. In an embodiment where the display 610 is touch-sensitive, a portion or all of the keypad 608 can be presented by way of the display 610 with navigation features.

The display 610 can use touch screen technology to also serve as a user interface for detecting user input. As a touch screen display, the communication device 600 can be adapted to present a user interface having graphical user interface (GUI) elements that can be selected by a user with a touch of a finger. The display 610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 610 can be an integral part of the housing assembly of the communication device 600 or an independent device communicatively coupled thereto by a tethered wireline interface (such as a cable) or a wireless interface.

The UI 604 can also include an audio system 612 that utilizes audio technology for conveying low volume audio (such as audio heard in proximity of a human ear) and high volume audio (such as speakerphone for hands free operation). The audio system 612 can further include a microphone for receiving audible signals of an end user. The audio system 612 can also be used for voice recognition applications. The UI 604 can further include an image sensor 613 such as a charged coupled device (CCD) camera for capturing still or moving images.

The power supply 614 can utilize common power management technologies such as replaceable and rechargeable batteries, supply regulation technologies, and/or charging system technologies for supplying energy to the components of the communication device 600 to facilitate long-range or short-range portable communications. Alternatively, or in combination, the charging system can utilize external power sources such as DC power supplied over a physical interface such as a USB port or other suitable tethering technologies.

The location receiver 616 can utilize location technology such as a global positioning system (GPS) receiver capable of assisted GPS for identifying a location of the communication device 600 based on signals generated by a constellation of GPS satellites, which can be used for facilitating location services such as navigation. The motion sensor 618 can utilize motion sensing technology such as an accelerometer, a gyroscope, or other suitable motion sensing technology to detect motion of the communication device 600 in three-dimensional space. The orientation sensor 620 can utilize orientation sensing technology such as a magnetometer to detect the orientation of the communication device 600 (north, south, west, and east, as well as combined orientations in degrees, minutes, or other suitable orientation metrics).

The communication device 600 can use the transceiver 602 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 606 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 600.

Other components not shown in FIG. 6 can be used in one or more embodiments of the subject disclosure. For instance, the communication device 600 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of each cell site of the acquired network. A classifier is a function that maps an input attribute vector, x=(x1, x2, x3, x4, . . . , xn), to a confidence that the input belongs to a class, that is, f(x)= confidence (class). Such classification can employ a probabilistic and/or statistical-based analysis (e.g., factoring into the analysis utilities and costs) to determine or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A system, comprising:
a redox battery system, wherein the redox battery system comprises a three dimensional array of a plurality of nano-batteries;
a hydrogen power system, wherein the hydrogen power system comprises a nano-array of hydrogen paper, a heat source and a water source, wherein the hydrogen paper is configured to attract hydrogen from the water source;
a solar power system, wherein the solar power system comprises an array of a plurality of nano-solar cells;
an ionic diode power system, wherein the ionic diode power system comprises two electrodes separated by a polycarbonate membrane, two borophene electric charge capture devices, and a capacitor stack;
a power supply controller comprising a processing system including a processor, and a memory that stores executable instructions that, when executed by the processing system, facilitate performance of operations, the operations comprising:
providing power to a linear amplifier using the redox battery system; and
causing recharging of the redox battery system utilizing at least one of the hydrogen power system, the solar power system, or the ionic diode power system to provide charge to the redox battery system.

2. The system of claim 1, wherein each of the plurality of nano-batteries comprises an anode and a cathode separated by a membrane, wherein each anode of each of the plurality of nano-batteries receives an anolyte from a first reservoir, wherein each cathode of each of the plurality of nano-batteries receives a catholyte from a second reservoir.

3. The system of claim 2, wherein the anolyte comprises pyridinium.

4. The system of claim 2, wherein the catholyte comprises iodide.

5. The system of claim 1, wherein a portion of the charge is generated in response to the hydrogen being captured from the hydrogen paper in response to the heat source being activated and applied to the hydrogen paper.

6. The system of claim 1, wherein each cell of the nano-array of hydrogen paper comprises a nanoplate catalyst that provides the hydrogen to a hydrogen collector.

7. The system of claim 6, wherein the hydrogen collector provides the hydrogen to each of a plurality of anode-cathode pairs, wherein a portion of the charge is collected from at least one of the plurality of anode-cathode pairs.

8. The system of claim 1, wherein each of the plurality of nano-solar cells comprise a Perovskite solar cell resulting in a plurality of Perovskite solar cells.

9. The system of claim 8, wherein each of the plurality of Perovskite solar cells is coupled to a riser resulting in a plurality of risers, wherein adjusting a riser of the plurality of risers adjusts an orientation of the Perovskite solar cell of the plurality of Perovskite solar cells.

10. The system of claim 9, wherein the adjusting of the riser of the plurality of risers comprises adjusting the riser of the plurality of risers in response to determining a time of day.

11. The system of claim 9, wherein the adjusting of the riser of the plurality of risers comprises adjusting the riser of the plurality of risers in response to determining a change in orientation of sunlight.

12. The system of claim 8, wherein each Perovskite solar cell of the plurality of Perovskite solar cells is coupled to a charge collector resulting in a plurality of charge collectors, wherein a portion of the charge is collected from at least one of the plurality of charge collectors.

13. The system of claim 8, wherein the plurality of Perovskite solar cells are arranged in a two dimensional array on a semiconductor, wherein each of the plurality of Perovskite solar cells captures ambient heat to heat a first side of the semiconductor.

14. The system of claim 13, wherein a portion of the charge is collected from the semiconductor.

15. The system of claim 1, wherein a portion of the charge is collected from ion flow between the two electrodes through the polycarbonate membrane by the two borophene electric charge devices.

16. The system of claim 15, wherein the portion of the charge is stored in the capacitor stack.

17. The system of claim 16, wherein the portion of the charge is provided by the capacitor stack in response to discharging the capacitor stack.

18. A non-transitory, machine-readable medium, comprising executable instructions that, when executed by a processing system including a processor, facilitate performance of operations, the operations comprising:
monitoring charge of a redox battery system;
detecting the charge is below a predetermined threshold based on the monitoring;
detecting an amount of hydrogen on a portion of hydrogen paper in a hydrogen power system;
determining an amount of sunlight according to a plurality of sensors, wherein a solar power system comprises the plurality of sensors; and
causing recharging of the redox battery system according to the amount of hydrogen and amount of sunlight, wherein the recharging of the redox battery system is performed by utilizing at least one of the hydrogen power system, the solar power system, or an ionic diode power system.

19. A method, comprising:
detecting, by a processing system including a processor, an amount of hydrogen on a portion of hydrogen paper in a hydrogen power system;
determining, by the processing system, an amount of sunlight according to a plurality of sensors, wherein a solar power system comprises the plurality of sensors; and
causing, by the processing system, recharging of a redox battery system according to the amount of hydrogen and amount of sunlight in response to detecting that a charge of the redox battery system is below a predetermined threshold, wherein the recharging of the redox battery system is performed by utilizing at least one of the hydrogen power system, the solar power system, or an ionic diode power system.

20. The method of claim 19, wherein the solar power system comprises an array of a plurality nano-Perovskite solar cells, wherein each of the nano-Perovskite solar cells are coupled to a riser resulting in a plurality of risers, wherein adjusting each riser of the plurality of risers adjusts an orientation of each nano-Perovskite solar cell, wherein the adjusting of each riser is in response to a sensor from the plurality of sensors detecting a change in an orientation of the sunlight.

* * * * *